United States Patent [19]
Goto

[11] 4,336,502
[45] Jun. 22, 1982

[54] AMPLIFIER WITH INPUT STAGE DIFFERENTIAL AMPLIFYING CIRCUIT

[75] Inventor: Motoomi Goto, Hamamatsu, Japan

[73] Assignee: Nippon Gakki Seizo Kabushiki Kaisha, Hamamatsu, Japan

[21] Appl. No.: 107,637

[22] Filed: Dec. 27, 1979

[30] Foreign Application Priority Data

Dec. 28, 1978 [JP] Japan .................................. 53-164842

[51] Int. Cl.³ .............................................. H03F 3/45
[52] U.S. Cl. .................................... 330/253; 330/256; 330/257; 330/258
[58] Field of Search ................ 330/253, 256, 257, 258

[56] References Cited

U.S. PATENT DOCUMENTS 3,786,362 1/1974 Marsh et al. ......................... 330/258

OTHER PUBLICATIONS

Brokaw et al., "A Fast, High-Precision, Laser-Trimmed FET Input Operational Amplifier", 1974, *IEEE International Solid-State Circuits Conferences*, pp. 142, 143, 244, Feb. 14, 1974.

*Primary Examiner*—James B. Mullins
*Attorney, Agent, or Firm*—Cushman, Darby & Cushman

[57] ABSTRACT

To the respective drains of a pair of FET's which constitute an input stage differential amplifier circuit are cascade-connected a first transistor and a second transistor, respectively, whose bases are connected in common. To a pair of active elements of the next stage amplifier circuit is connected a detecting circuit for detecting the sum of the driving currents of these active elements. By the output of detection of the detecting circuit, the potential of the common base of the first and second transistors is controlled, so that the currents flowing through these first and second transistors are held constant, whereby the apparent load, for input signals, of the paired FET's is elevated.

6 Claims, 5 Drawing Figures

4,336,502

AMPLIFIER WITH INPUT STAGE DIFFERENTIAL AMPLIFYING CIRCUIT

BACKGROUND OF THE INVENTION (a) Field of the invention

The present invention pertains to an amplifier having an input stage differential amplifying circuit with a large voltage amplification factor.

(b) Description of the prior art

A typical example of circuit diagram of a known amplifier of this type is shown in FIG. 1, which comprises: an input stage amplifying circuit having a pair of field effect transistors (hereinafter to be referred to briefly as FET or FET'S) 1 and 2, a potentiometer 3 assigned for offset adjustment and having an overall resistance value Rs, a constant current source 4, and a load resistor 5 having a resistance value Rl/2 for the FET 1 and another load resistor 6 having a resistance value Rl/2 for the FET 2; and a next stage differential amplifying circuit having a pair of transistors 8 and 9, a resistor 7 inserted in common in the respective emitter circuits of these paired transistors 8 and 9, and a load resistor 10 for the transistor 9. If the transconductance of these FET's is designated as $g_m$, the voltage gain Av of the input stage amplifying circuit is expressed by:

$$Av = \frac{Rl}{\frac{1}{g_m} + Rs}.$$

Accordingly, in order to enhance the voltage gain Av in the amplifier shown in FIG. 1, there may be considered various ways such as: (a) increasing the resistance value Rl/2 of the respective load resistors 5 and 6, (b) increasing the transconductance $g_m$ of the FET's (it is considered in general that it is only necessary to increase the drain currents of FET's in order to increase the transconductance $g_m$ of these FET's), and (c) minimizing the value Rs of the potentiometer. It should be noted, however, that in case the resistance value Rl/2 of the load resistors 5 and 6 is increased to enhance the voltage gain of the amplifier, it will be necessitated to minimize the drain currents of the respective FET's 1 and 2 in association with the voltage level of the power supply. Also, in case the drain currents $I_d$ of the FET's 1 and 2 are increased, for the same purpose stated above, it will become necessary to minimize the resistance value Rl/2 of the load resistors 5 and 6. Furthermore, the value Rs of the variable resistor need to have a value of a certain extent, i.e. several tens of ohms, to expect balanced differential operation of the amplifier. For these reasons, in the conventional amplifiers of the type whose input stage is constructed by a differential amplifying circuit using, especially, FET's, it has been difficult to expect stabilized operation at high voltage gain.

On the other hand, as a circuit for obtaining a high voltage gain, there is known the so-called differential three-stage amplifying circuit. This prior art amplifying circuit, however, has the inconveniences and difficulties such as the difficulty in performing compensation of phase, lack of stable operation and complexity of circuit arrangement.

SUMMARY OF THE INVENTION

The present invention has been worked out to overcome the abovesaid inconveniences and difficulties of the prior art amplifiers using, especially, FET's in their input stage amplifying circuit, and intends to provide an amplifier which allows a high voltage gain without sacrificing stable amplifying operation and which is simple in circuit arrangement.

More particularly, the present invention contemplates the provision of an amplifier of the type whose initial or input stage is constructed by a differential amplifying circuit using FET's, said amplifier having the arrangement comprising: transistors cascadeconnected to the drains of the FET's, respectively; and a detecting circuit series-connected to an active element of the next-stage amplifying circuit to detect the summed-up current of the driving currents of a pair of active elements provided in this next-stage amplifying circuit, so that the base potential of those transistors cascade-connected to the FET's is controlled by the detection output of the detecting circuit to thereby maintain the operating point constant, whereby increasing the apparent load of the FET's for AC signals and enhancing the voltage gain of the amplifier.

BRIEF DESCRIPTION OF THE DRAWINGS

Like parts are indicated by like reference numerals throughout the drawings.

DETAILED DESCRIPTION OF THE PREFERRED EMBODIMENTS

Description of the present invention will hereunder be made with respect to some preferred embodiments by referring to the accompanying drawings.

Figure 1:
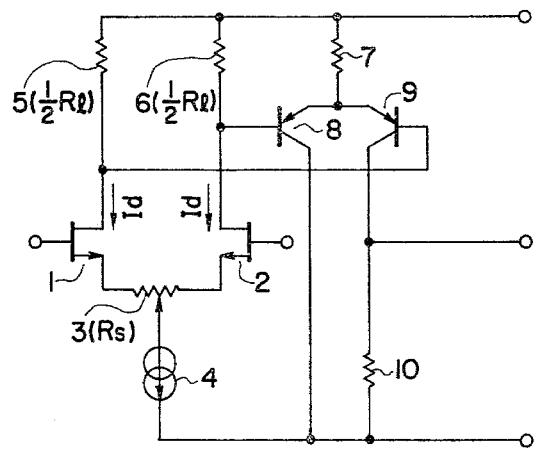
FIG. 1 is a circuit diagram showing a example of the conventional amplifier arrangement.
Figure 2:
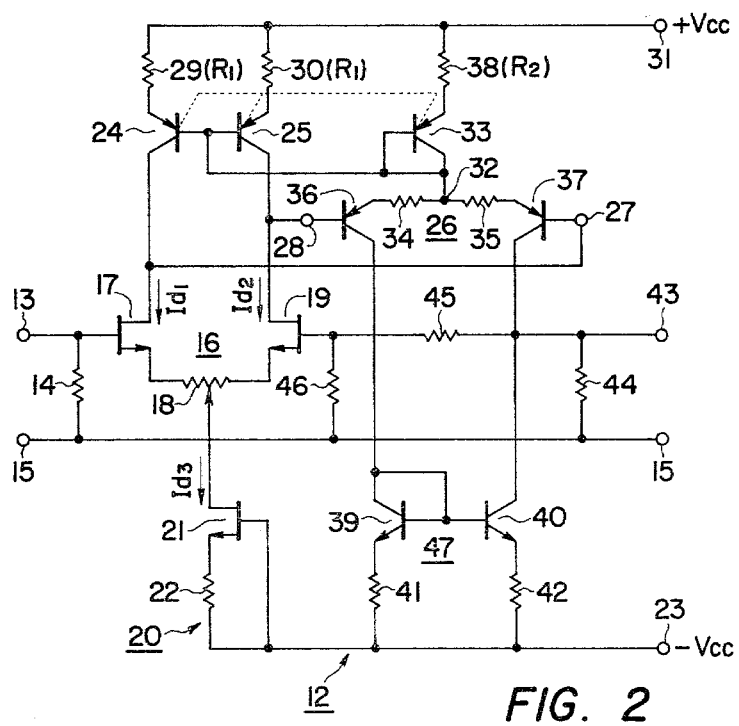
FIGS. 2 through 5 are circuit diagrams showing embodiments of the present invention.

FIG. 2 is a circuit diagram showing the arrangement of an embodiment of the amplifier according to the present invention. In FIG. 2, an input terminal 13 of an amplifier generally indicated at 12 is connected to a grounded terminal 15 via a resistor 14, and further to a gate of a first FET 17 which constitutes an input stage differential amplifying circuit generally indicated at 16. A source of this FET 17 is connected to one of the terminals of a potentiometer 18. The other one of the terminals of this potentiometer 18 is connected to a source of a second FET 19. The slidable contact of the potentiometer 18 is connected to a drain of an FET 21 which constitutes a constant current source 20. A source of this FET 21 is connected to a negative power supply terminal 23 via a resistor 22. Also, a gate electrode of this FET 21 is directly connected to the negative power supply terminal 23. The drain electrodes of said first and second FET's 17 and 19 are connected to the collectors of a first transistor 24 and of a second transistor 25, respectively, and further to input terminals 27 and 28 of a next-stage amplifying circuit which is a differential amplifier generally indicated at 26, respectively. Also, emitters of said first and second transistors 24 and 25 are connected to a positive power supply terminal 31 via a first resistor 29 and a second resistor 30, respectively. Furthermore, bases of the first and second transistors 24 and 25 are connected to a common terminal 32 of the next-stage amplifying circuit 26. This common terminal 32 is connected to a collector and a base of a temperature-compensating transistor 33, and further to an emitter of a transistor 36 via a resistor 34 and also to an emitter of another transistor 37 via a resistor 35. An emitter of the transistor 33 is connected to a positive power supply terminal 31 via a third resistor 38 to constitute a detecting circuit for detecting the sum of driving currents of said transistors 36 and 37. Bases of these transistors 36 and 37 are connected to said input terminals 28 and 27 of the next-stage amplifying circuit 26, respectively. Collectors of these transistors 36 and 37 are arranged to be connected to collectors of transistors 39 and 40, respectively. Bases of these transistors 39 and 40 are connected jointly to the collector of the transistor 39. Emitters of the transistors 39 and 40 are connected to the negative power supply terminal 23 via resistors 41 and 42, respectively. Also, a collector of the transistor 40 is connected to an output terminal 43. The transistors 39, 40 and the resistors 41, 42 jointly constitute a current mirror circuit generally indicated at 47. The output terminals 43 is connected to the grounded terminal 15 via a resistor 44, and further to the gate electrode of the FET 19 via a negative feedback resistor 45. This gate of the FET 19 is connected to the grounded terminal 15 via a resistor 46. The first and second transistors 24 and 25 and the temperaturecompensating transistor 33 are secured integrally to a heat-radiating plate having a good thermal conductivity for the purpose of thermal-coupling.

Next, description will be made of the operation of the amplifier circuit having the aforesaid arrangement. Here, let us assume that the currents flowing through the respective drain electrodes of the first and second FET's 17, 19 and of the FET 21 are designated as $I_{d1}$, $I_{d2}$ and $I_{d3}$, respectively. In the state of no signal being applied, their relationship is:

$$I_{d1} = I_{d2} = \tfrac{1}{2} I_{d3} \qquad (2)$$

The potential of the common base of the first and second transistors 24 and 25, i.e. the potential of the common terminal 32 of the next-stage amplifying circuit 26, is provided as a constant value which is determined by the following three factors, i.e. the current value in the aforesaid Equation (2), the resistance value $R_1$ of the first and second resistors 29 and 30, and the emitter-base voltage of said first and second transistors 24 and 25. And, a voltage drop of the third resistor 38, i.e. the potential at the connecting point of the third resistor 38 and the temperature-compensating transistor 33, is determined by the following factors, i.e. the resistance value $R_2$ of the resistor 38, the emitter-base voltage of the transistor 33 and the potential of the common terminal 32.

In case an input signal is applied between the input terminal 13 and the grounded terminal 15, the current $I_{d1}$ of the first FET 17 and the current $I_{d2}$ of the second FET 19 will vary in opposite phase relative to each other because of the nature of the differential amplifying circuit which these FET's constitute. Accordingly, the collector currents of the transistors 36 and 37 also will vary in opposite phase relative to each other. Thus, the current which flows through the third resistor 38, i.e. the sum of the driving currents of the transistors 36 and 37, will not vary at all. Therefore, the potential at the common bases of the transistors 24 and 25 is controlled to be constant even in case an input signal is applied to the input terminal 13, i.e. the base potential of the first and second transistors 24 and 25 will be held constant in a same way as at the time that no signal is applied. Thus, the current which flows through the first resistor 29 and the collector of the first transistor 24, and the current flowing through the second resistor 30 and the collector circuit of the second transistor 25 will always run as constant currents, respectively. Accordingly, those first and second transistors 24 and 25 which are cascade-connected to the first and second FET's 17 and 19 may be regarded as merely serving as DC loads or biasing loads for the differential input FET's. In other words, these first and second transistors 24 and 25 may be regarded as if they are in their non-conducting state when viewed AC-wise. Thus, a load, in the sense of input signal, to the pair FET's 17 and 19 may be regarded safely as being limited only to the input resistances of the input terminals 27 and 28. Accordingly, the apparent load which is represented by said input resistances of the input terminals 27 and 28 is considered as having a considerably large value. This means that the input stage amplifying circuit 16 can be concluded as having a high voltage gain, as will be noted also from Formula (1).

Also, as stated previously, the transistor 33 is a temperature-compensating transistor, and is thermally coupled to the first and second transistors 24 and 25. Therefore, in case the collector currents of these transistors 24 and 25 exhibit a tendency to vary in a certain way due to a change in the ambient temperature, the mitter-base voltage of this transistor 33 will vary in the same way. As a result, the collector currents of the transistors 36 and 37 can be maintained constant. For example, in case the emitter-base voltage of the first and second transistors 24 and 25 exhibit a tendency to decrease due to an elevation of ambient temperature, the emitter-base voltage of the transistor 33 will also drop, so that the emitter potential of the transistor 33 is held constant with the result that the current flowing through the resistor 38 and the transistor 33 to the circuit 26 is maintained constant.

As will be understood, an input signal which is applied to both the input terminal 13 and the grounded terminal 15 is first amplified by the abovedescribed input stage amplifying circuit 16, and thereafter it is inputted, via the input terminals 27 and 28, to the next-stage amplifying circuit 26 wherein it is amplified. As seen from the consideration that the first and second transistors 24 and 25 which are cascade-connected to the first and second FET's 17 and 19, respectively, may be regarded practically as being in their "off" state, the next-stage amplifying circuit 26 is, so to speak, is driven by current. As such, there is provided an amplifier which develops very little non-linear distortion when compared with conventional voltage-driven type amplifiers. Also, from the consideration that the load of this next-stage amplifying circuit 26 is the current mirror circuit 47, it will be understood that the transistor 37 and the transistor 40 exhibit complementary operation, and thus a large current gain can be obtained. The amplified signal is derived at the output terminal 43, and also fed back to the input stage differential circuit 16 via the resistor 45.

Figure 3:
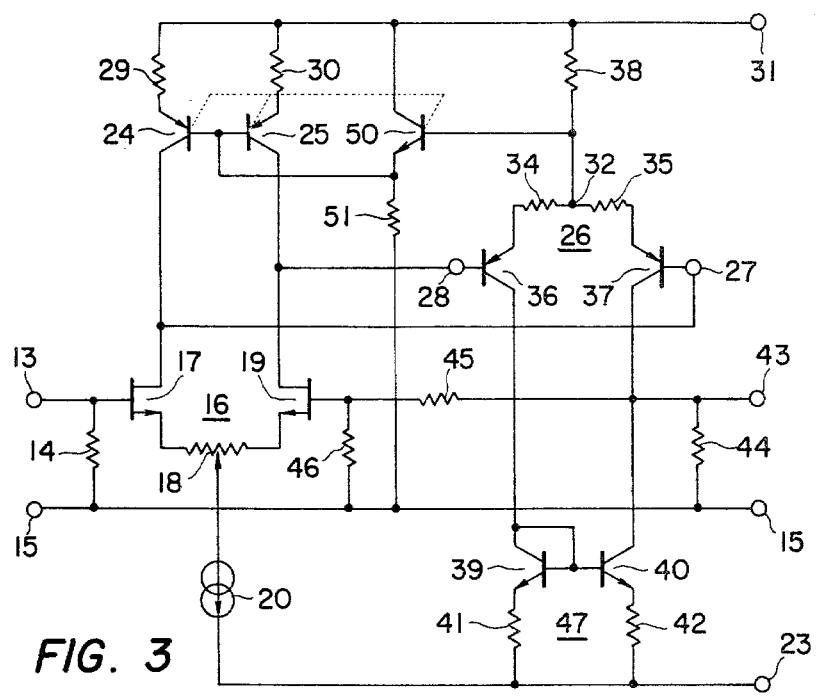

FIG. 3 is a circuit diagram showing another embodiment of the present invention. In FIG. 3, those parts corresponding to the parts shown in FIG. 2 are indicated by same reference numerals.

The circuitry shown in FIG. 3 has an arrangement similar to that shown in FIG. 2, excepting that the temperature-compensation transistor 33 shown in FIG. 2 is replaced by an emitter-follower transistor 50. A base of this transistor 50 is connected to a common terminal 32 of the next-stage differential amplifying circuit 26. A collector of this transistor 50 is connected to the positive power supply terminal 31. Also, an emitter thereof is connected to a common base of the first and second transistors 24 and 25, and further to the grounded terminal 15 via a resistor 51. The transistor 50 is preferably thermal-coupled with the transistors 24 and 25. In the circuitry shown in FIG. 3, there are provided practically the same effects and functions as those obtained from the arrangement shown in FIG. 2.

Figure 4:
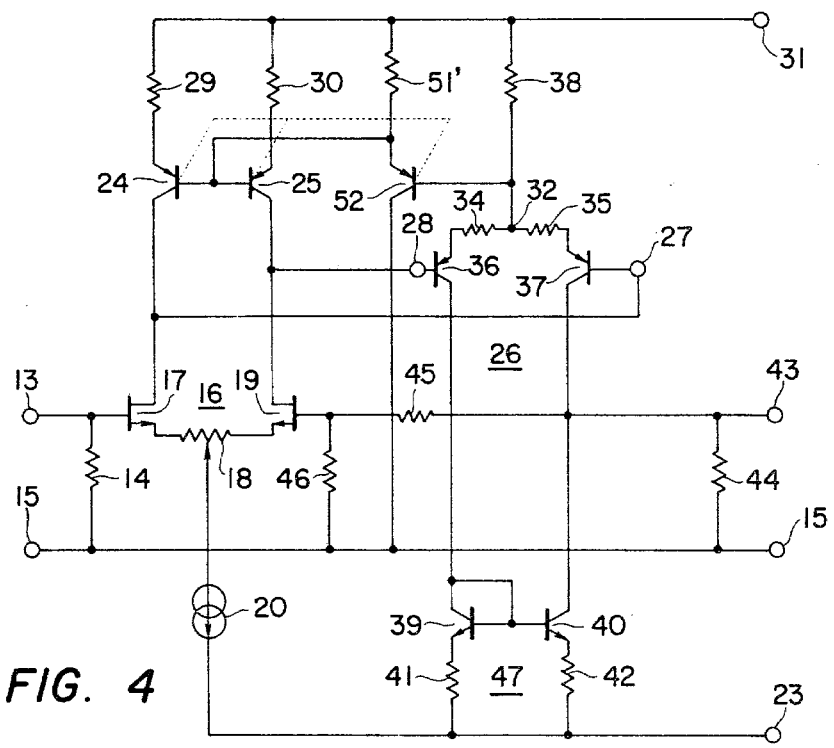

It should be understood that the emitter-follower transistor 50 shown in FIG. 3 may be comprised of a PNP-type transistor 52 thermal-coupled with the transistors 24 and 25 as shown in FIG. 4, with the same result. In FIG. 4, parts corresponding to those in FIG. 3 are indicated by like reference numerals.

Figure 5:
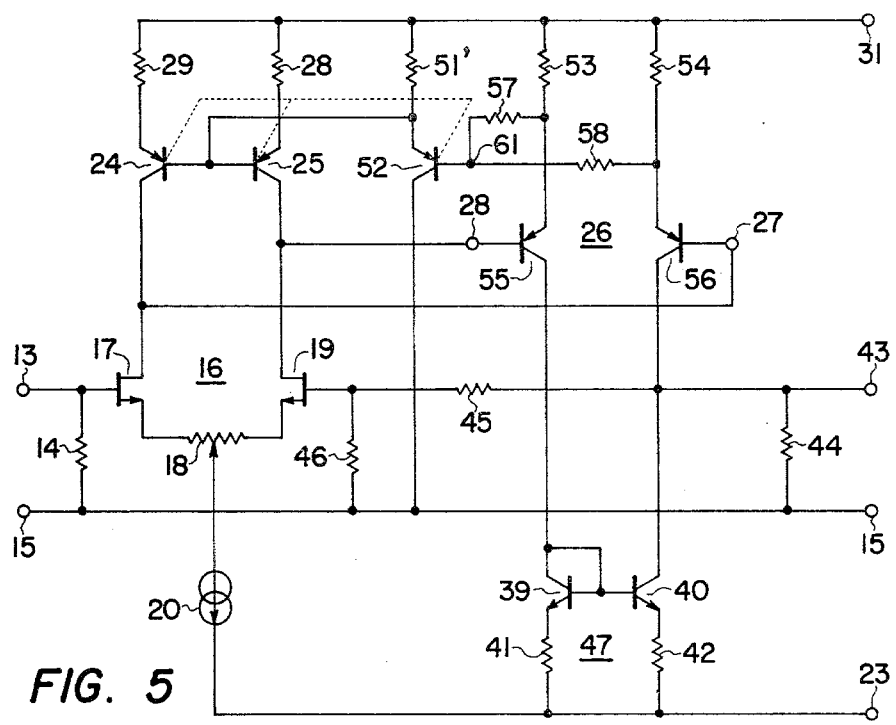

Furthermore, the next-stage amplifying circuit may be constructed by an emitter-grounded type amplifying circuit in place of the differential amplifying circuit, in a manner as shown in FIG. 5. It should be understood here again that parts corresponding to those in FIG. 3 are indicated by like reference numerals. The circuit arrangement of FIG. 5 is similar to that shown in FIG. 3, excepting that the next-stage amplifying circuit is constructed by an emitter-grounded amplifying circuit comprising transistors 55 and 56 whose bases are connected to the drains of the first and second FET's 17 and 19, respectively, and whose emitters are connected to the positive power supply terminal 31 via resistors 53 and 54, respectively, and whose collectors are connected to the collectors of the transistors 39 and 40 which, in turn, jointly constitute a current mirror circuit 47, and further excepting that, thus, the emitters of these transistors 55 and 56 are connected to the base of the transistor 52 via resistors 57 and 58, respectively. It should be noted that these resistors 53, 54, 57 and 58 jointly form a detecting circuit, corresponding to the detecting circuit 38 of FIG. 2, for detecting the sum of the driving currents of the transistors 55 and 56. Here, let us assume that these resistors 53, 54, 57 and 58 have resistance values $R_3$, $R_4$, $R_5$ and $R_6$, respectively. Then, these resistors are set so that $R_3 = R_4$, and $R_5 = R_6$. By so arranging, the potential at the connecting point 61 of the resistor 57 and the resistor 58 will represent a mean value of the emitter potential of the transistor 55 and the emitter potential of the transistor 56. Also, the emitter potentials of these transistors 55 and 56 will have values corresponding to the driving currents (emitter currents) of these respective transistors. As such, the potential as said connecting point 61 will have a value, which in effect is a mean value, corresponding to a sum current of the driving currents of both transistors 55 and 56. Also, the next-stage amplifying circuit 26 which is comprised of these transistors 55 and 56 is adapted to be applied with a differential input from the input stage differential circuit 16. Furthermore, this next-stage amplifying circuit 26 has a current mirror circuit 47 connected thereto. Therefore, the next-stage amplifying circuit 26 operates practically as a differential amplifying circuit. As a result, the sum current of the driving currents of the transistors 55 and 56 will be provided as a constant current even when a signal is applied, in the same way as stated in connection with the respective preceding embodiments. Thus, the potential at the connecting point 61, i.e. the potential of the base of the transistor 52, becomes constant. Therefore, the base potential of the first and second transistors 24 and 25 is held constant, and accordingly their collector currents are maintained constant.

It should be understood that the input stage differential amplifying circuit 16 shown in FIGS. 2 through 5 may be materialized also by bipolar transistors. The present invention, however, is intended primarily to improve the conventional amplifier using FET's which have been difficult in obtaining high transconductance $g_m$. Therefore, the present invention is particularly effective when applied to amplifiers using differential input FET's. The next-stage amplifying circuit 26 may also be comprised of FET's.

As stated above, according to the present invention, it should be noted that, in an amplifier whose initial or input stage is constructed by a differential amplifying circuit, it is possible to make the load of the input stage differential amplifying circuit highly resistive to input signal. Thus, it is possible to construct, by simplified arrangement, an amplifier having high voltage gain, low distortion and highly stable operation. Moreover, the present invention has a further advantage represented by large CMRR (Common Mode Rejection Ratio) and large SVRR (Supply Voltage Rejection Ratio).

What is claimed is:

1. An amplifier comprising:
    an input stage differential amplifying circuit including differentially connected first and second transistors each having a conduction path, a constant current source commonly connected between one ends of the conduction paths of said first and second transistors and a first power supply, third and fourth transistors cascade-connected respectively to said first and second transistors at the other ends of said conduction paths and having control electrodes connected in common, and first and second resistance means connected between said third and fourth transistors and a second power supply, respectively;
    a succeeding stage amplifying circuit including fifth and sixth transistors having conduction paths and control electrodes which electrodes are connected respectively to said other ends of the conduction paths of said first and second transistors;
    first circuit means for detecting a sum of driving currents flowing through the conduction paths of said fifth and sixth transistors, and comprising third and fourth resistance means inserted respectively between one ends of the conduction paths of the fifth and sixth transistors and the second power supply, and fifth and sixth resistance means having one ends connected to the connection points of said third resistance means and said fifth transistor and of said fourth resistance means and said sixth transistor, respectively and the other ends connected in common; and
    second circuit means for controlling potential of the common control electrodes of said third and fourth transistors in accordance with the sum of the driving currents of said fifth and sixth transistors, and inserted between the common control electrodes of said third and fourth transistors and the common connection point of said fifth and sixth resistance means, thereby maintaining constant said common control electrode potential of the third and fourth transistors.

2. An amplifier according to claim 1, in which:
    said succeeding stage amplifying circuit has a current mirror circuit series-connected to said fifth and sixth transistors.

3. An amplifier according to claim 1, in which:

said second circuit means comprises an emitter-follower circuit connected between said common connection point of the fifth and sixth resistance means and the common control electrodes of said third and fourth transistors.

4. An amplifier according to claim 3, in which:
said emitter-follower circuit comprises a seventh transistor having a base electrode connected to said common connection point of the fifth and sixth resistance means, an emitter electrode connected to the common control electrodes of the third and fourth transistors, and a collector electrode connected to a certain DC potential, and a seventh resistance means connected between the emitter electrode of said seventh transistor and said second power supply.

5. An amplifier according to claim 4, in which:
said seventh transistor is thermal-coupled with said third and fourth transistors for cancelling out a change in conduction control voltage of said third and fourth transistors caused by a change in ambient temperature.

6. An amplifier according to any one of claims 1 to 5, in which:
said first and second transistors are fieldeffect transistors.

* * * * *